United States Patent
Wang et al.

(10) Patent No.: US 7,243,321 B2
(45) Date of Patent: Jul. 10, 2007

(54) IC LAYOUT PHYSICAL VERIFICATION METHOD

(75) Inventors: Xiaojun Wang, Cary, NC (US); Kenneth Mednick, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 301 days.

(21) Appl. No.: 10/820,365

(22) Filed: Apr. 7, 2004

(65) Prior Publication Data

US 2005/0229126 A1    Oct. 13, 2005

(51) Int. Cl.
G06F 17/50     (2006.01)
G06F 17/10     (2006.01)

(52) U.S. Cl. .................. 716/5; 716/2; 716/3; 716/4; 703/2; 703/13

(58) Field of Classification Search .............. 716/1, 716/4–7, 8, 19–21, 17; 703/2, 13, 14; 257/531; 702/65; 382/154; 430/5
See application file for complete search history.

(56) References Cited

U.S. PATENT DOCUMENTS

| | | | |
|---|---|---|---|
| 5,497,337 A * | 3/1996 | Ponnapalli et al. | 716/19 |
| 5,892,425 A * | 4/1999 | Kuhn et al. | 336/200 |
| 6,500,722 B2 * | 12/2002 | Wada et al. | 438/381 |
| 6,560,567 B1 * | 5/2003 | Yechuri | 703/2 |
| 6,588,002 B1 * | 7/2003 | Lampaert et al. | 716/8 |
| 6,775,807 B2 * | 8/2004 | Lowther et al. | 716/1 |
| 2002/0184603 A1 * | 12/2002 | Hassibi et al. | 716/2 |
| 2004/0183156 A1 * | 9/2004 | Lowther | 257/531 |
| 2005/0125751 A1 * | 6/2005 | Miller et al. | 716/4 |
| 2005/0229126 A1 * | 10/2005 | Wang et al. | 716/5 |

OTHER PUBLICATIONS

Frlan et al. "Computer aided design of square spiral transformers and inductors [MIC application]", Jun. 13-15, 1989, Microwave Symposium Digest, 1989., IEEE MTT-S International, pp. 661-664 vol. 2.*

Lingling et al., "A simple equivalent circuit model CMOS multi-level spiral inductors", Aug. 18-21, 2004 , Microwave and Millimeter Wave Technology, 2004. ICMMT 4th International Conference on, Proceedings, pp. 562-565.*

(Continued)

Primary Examiner—Paul Dinh
Assistant Examiner—Helen Rossoshek
(74) Attorney, Agent, or Firm—Rosenberg, Klein & Lee

(57) ABSTRACT

Responding to a single command, a layout versus schematic (LVS) tool processes layout data describing positions of conductors on layers of an IC to produce data representing a shape recognition layer depicting boundary shapes of spirals of drawn inductors. The boundary shape of a spiral is the shape of the spiral as viewed from above with all of the layers of conductive material forming the spiral superimposed. The LVS tool then processes the shape recognition layer data to identify the type and position of each drawn inductor, to determine whether each inductor's spiral turns are of uniform width and spacing, to detect connectivity violations, and to determine parameters relating to the shape of the spiral from which its inductance can be computed.

30 Claims, 8 Drawing Sheets

OTHER PUBLICATIONS

Yu et al., "Frequency-independent equivalent-circuit model for on-chip spiral inductors", Mar. 2003, Solid-State Circuits, IEEE Journal of☐☐vol. 38, Issue 3, pp. 419-426.*

Feng et al., "Large-scale broadband parasitic extraction for fast layout verification of 3D RF and mixed-signal on-chip structures",Jun. 6-11, 2004, Microwave Symposium Digest, IEEE MTT-S Internationalvol. 3, pp. 1399-1402 vol. 3 ☐☐.*

Masoumi et al., "Fast and efficient parametric modeling of contact-to-substrate coupling", Nov. 11, 2000, Computer-Aided Design of Integrated Circuits and Systems, IEEE Transactions on, vol. 19, Issue pp. 1282-1292.*

Niknejad et al., "Analysis, design, and optimization of spiral inductors and transformers for Si RF ICs", Oct. 1998, Solid-State Circuits, IEEE Journal of, vol. 33, Issue 10, pp. 1470-1481.*

Ban-Leong et al., "A comprehensive explanation on the high quality characteristics of symmetrical octagonal spiral inductor",Jun. 8-10, 2003, Radio Frequency Integrated Circuits (RFIC) Symposium, IEEE, pp. 259-262.*

Ooi et al., "Modified inductance calculation with current redistribution in spiral inductors",Dec. 2003, Microwaves, Antennas and Propagation, IEE Proceedings-, vol. 150, Issue 6, pp. 445-450.*

Stojanovic et al.,"Comparison of optimal design of different spiral inductors", May 16-19, 2004 ,Microelectronics, 24th International Conference on,vol. 2, pp. 613-616 vol. 2 ☐☐.*

Lee et al., "Design of spiral inductors on silicon substrates with a fast simulator", Sep. 22-24, 1998 ,Solid-State Circuits Conference, ESSCIRC '98. Proceedings of the 24th European,pp. 328-331.*

Zhu et al., "Micromachined on-chip inductor performance analysis", Jan. 19-23 2003 ,Micro Electro Mechanical Systems, MEMS-03 Kyoto. IEEE The Sixteenth Annual International Conference on, pp. 165-168.*

Arcioni et al., "Design and characterization of Si integrated inductors", May 18-21, 1998, Instrumentation and Measurement Technology Conference, IMTC/98. Conference Proceedings. IEEE, vol. 2, pp. 1395-1401 vol. 2.*

* cited by examiner

IC LAYOUT PHYSICAL VERIFICATION METHOD

BACKGROUND OF THE INVENTION

1. Field of the Invention

The invention relates in general to an IC "layout vs. schematic" (LVS) physical verification method for detecting connectivity and uniformity violations in an on-chip drawn inductor, for verifying its shape, and for extracting the inductor device and its parameters.

2. Description of Related Art

An integrated circuit (IC) designer may initially generate an IC design in the form of a schematic netlist referencing instances of the IC circuit devices ("cells") to be included in the IC, referencing the nets to convey signals within the IC, and indicating the cell instance terminals to be connected to each net. Thereafter the designer may use a computer-aided design tool to generate an IC layout indicating how and where each circuit device is to be formed within the IC and describing the actual route conductors within the IC are to follow to interconnect device terminals. A typical IC consists of several layers of semiconductor, insulator and conductive material and an IC layout includes binary data associated with each layer of the IC mapping the geometric material or doping patterns needed to implement the various cells.

After generating an IC layout, a designer will often employ a "layout vs. schematic" (LVS) physical verification tool to verify that device components such as gates, transistors, resistors and capacitors and their interconnections are consistent with the schematic or netlist description of the IC. An LVS tool processes the IC layout to identify IC circuit devices and interconnects based on their representative geometric patterns and to create another netlist describing the IC represented by the layout. Following this "extraction" process, the LVS tool reviews the extracted netlist to identify errors in the layout including shorts and opens and malformed devices. The LVS tool also compares the extracted netlist to the original netlist to determine whether there are any differences with respect to relative to devices, interconnection and circuit parameters.

One of the components that an IC may include is a drawn inductor, a passive circuit component used for example, in cell phones, global positioning system (GPS) receivers and other modern portable communication systems. Recently, design engineers have begun to incorporate drawn inductors into analog and Radio Frequency (RF) ICs. An on-chip drawn inductor typically includes one or more conductors formed in the shape of a spiral having an inductance that is a predictable function of its shape. The two most common types of drawn inductors are the 3-terminal center tap inductor and the 2-terminal spiral inductor. The center tap inductor include terminals on opposite ends of its spiral and a center tap terminal connected to the middle of the spiral. A spiral inductor includes a terminal on an outer end of is spiral and a center tap terminal connected to inside end of its spiral. To generate high inductance an inductor may include multiple spiral or spoke shapes, each residing on a separate layer of the IC.

IC fabricators typically impose several design rules/restrictions on the spiral of the drawn inductor. For example, an IC fabricator may require the spiral to have a uniform wire width and uniform spacing between turns of the wire, to have a uniform inner diameter and uniform "bend angles" between successive straight sections of wire forming the spiral. For example, a spiral may include only 45 degree bend angles or only 90 degree bends but may not include both 45 degree and 90 degree bend angles.

Since a drawn inductor is defective if it breaks any of the above rules, it is helpful before submitting an IC layout design for fabrication to perform a "uniformity check" of each drawn inductor within the layout to determine whether it satisfies the above rules. It is also helpful to perform a "connectivity check" on each drawn inductor to determine whether it its spiral and its center tap or spoke terminal are correctly interconnected and to determine whether multiple layers of conductors and vias forming an inductor terminal are properly interconnected. A designer will also want to verify the inductance of each drawn inductor by first measuring the geometric parameters influencing the inductor's inductance such as, for example, its spiral length, spacing between spiral turns, spiral inner diameter, total number of turns, and the number of sides per turn. The designer can then calculate the inductor's inductance based on such parameters by using well-known inductance formula, such as, for example, the Current Sheet Approximation Formula described in "Simple Accurate Expressions for Planar Spiral Inductances" by S. Mohan, et al., *IEEE J. Solid-State Circuits*, vol. 34, pp. 1419–1424, October 1999.

Currently, a design engineer using an LVS tool for physical verification of on-chip drawn chip inductors must generate a large number of device extraction commands to extract the components of the drawn inductors in the layout and then use a series of device parameter extraction rules to measure the inductor parameters and calculate the inductance. The designer usually has difficulty extracting a drawn inductor's geometric parameters due to the complex nature of its spiral shape, and when multiple layers form each terminal of the device, the designer finds it hard to check the proper connectivity between the multiple layers.

Thus employing prior art LVS tools a user must write hundreds of commands to check drawn inductors for shape and connectivity violations and to perform drawn inductor extraction. What is needed is a method for use by an LVS tool that can respond to a single command by quickly and efficiently recognizing drawn inductors in a layout, detecting shape and connectivity violations in those drawn inductors and extracting inductor device parameters.

BRIEF SUMMARY OF THE INVENTION

Responding to a single command, a layout versus schematic (LVS) tool in accordance with the invention processes layout data describing positions of conductors on layers of an IC to produce data representing a shape recognition layer depicting boundary shapes of spirals of drawn inductors. The boundary shape of a spiral is the shape of the spiral as viewed from above with all of the layers of conductive material forming the spiral superimposed. The LVS tool then processes the shape recognition layer data to identify the type and position of each drawn inductor, to determine whether each inductor's spiral turns are of uniform width and spacing, to detect connectivity violations, and to determine parameters relating to the shape of the spiral from which its inductance can be computed.

The claims appended to this specification particularly point out and distinctly claim the subject matter of the invention. However those skilled in the art will best understand both the organization and method of operation of what the applicant(s) consider to be the best mode(s) of practicing the invention by reading the remaining portions of the specification in view of the accompanying drawing(s) wherein like reference characters refer to like elements.

DETAILED DESCRIPTION OF THE INVENTION

Figure 1:
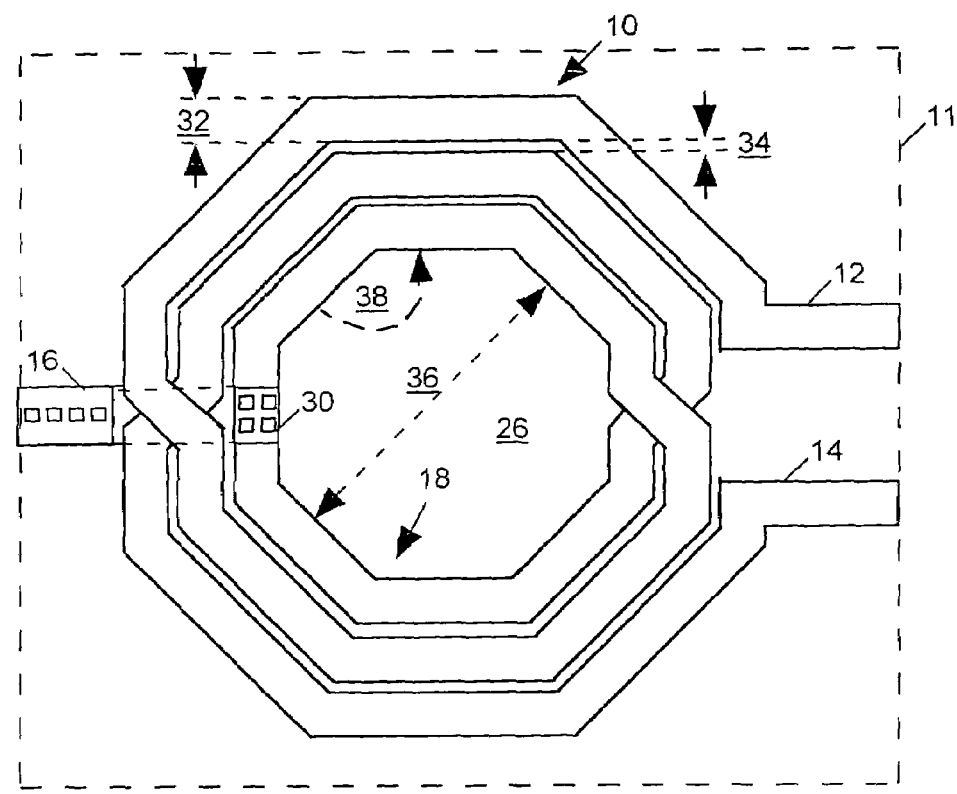
FIG. 1 is a simplified plan view of a prior art drawn center tap inductor.

The present invention relates to a method for use by a "layout vs. schematic" (LVS) physical verification tool for identifying on-chip drawn inductors, for detecting connectivity and uniformity violations in the drawn inductors, and for measuring parameters that influence their inductance. The invention is suitably in the form of software stored on computer-readable media read and executed by a conventional computer acting as an LVS physical verification tool. Suitable computer-readable media for storing the software include, but are not limited to, compact disks, floppy disks, hard disks, and random access or read only memory. While the specification describes at least one exemplary embodiment of the invention considered a best mode of practicing the invention, those of skill in the art will appreciate that the invention need not be limited to the particular example(s) described below or to the manner in which they operate.

An integrated circuit (IC) designer may initially generate an IC design in the form of a schematic netlist referencing instances of the IC circuit devices ("cells") to be included in the IC, referencing the nets to convey signals within the IC, and indicating the cell instance terminals to be connected to each net. Thereafter the designer may use a computer-aided design tool to generate an IC layout indicating how and where each circuit device is to be formed within the IC and describing the actual route conductors within the IC are to follow to interconnect device terminals. A typical IC consists of several layers of semiconductor, insulator and conductive material and an IC layout includes binary data associated with each layer of the IC mapping the geometric material or doping patterns needed to implement the various cells.

After generating an IC layout, a designer will often employ a "layout vs. schematic" (LVS) physical verification tool to verify that device components such as gates, transistors, resistors and capacitors and their interconnections are consistent with the schematic or netlist description of the IC. An LVS tool processes the IC layout to identify IC circuit devices and interconnects based on their representative geometric patterns and to create another netlist describing the IC represented by the layout. Following this "extraction" process, the LVS tool reviews the extracted netlist to identify errors in the layout including shorts and opens and malformed devices. The LVS tool also compares the extracted netlist to the original netlist to determine whether there are any differences with respect to relative to devices, interconnection and circuit parameters.

Recently, design engineers have begun to incorporate drawn inductors into analog and Radio Frequency (RF) ICs. A drawn inductor is a passive circuit component used, for example, in cell phones, global positioning system (GPS) receivers and other modern portable communication systems. An on-chip drawn inductor typically includes one or more conductors formed in the shape of a coil or spiral having an inductance that is a predictable function of its shape. The two most common types of drawn inductors are the three-terminal center tap inductor and the two-terminal spiral inductor.

FIG. 1 is a simplified plan view of a typical three-terminal center tap inductor including a conductive spiral 10, two conductive end terminals 12 and 14 and a conductive center tap terminal 16. Spiral 10 may have a varying number of turns and may be substantially octagonal in shape (as shown) with internal bends 18 defining a 45-degree angle, or may have other shapes. For example, a substantially square-shaped spiral will have 90-degree internal bends.

Figure 2:
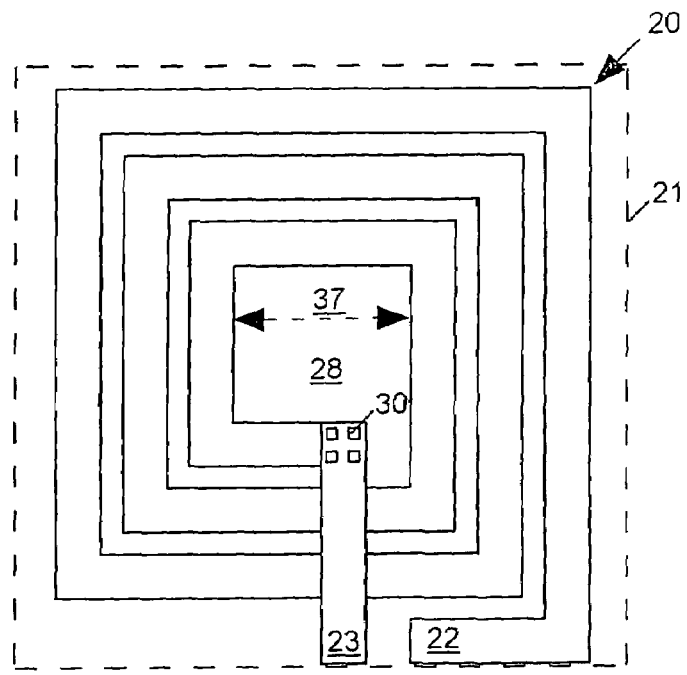
FIG. 2 is a simplified plan view of a prior art drawn spiral inductor.

FIG. 2 is a simplified plan view of a typical two-terminal spiral inductor including a conductive spiral 20, a conductive end terminal 22 and a conductive spoke terminal 24. Spiral 20 may be substantially rectangular as shown or may or may have other shapes. When the conductors forming spiral 10 or 12 of FIG. 1 or 2 are of uniform width and spacing, and the spiral's internal bends are uniform, then the inductance of a drawn can be computed as a function of various geometric parameters describing the spiral. Such parameters can include, for example, the number of sides of the spiral, the length, width and spacing of the spiral conductors, and the width of the space 26 or 28 they substantially surround.

Figure 3:
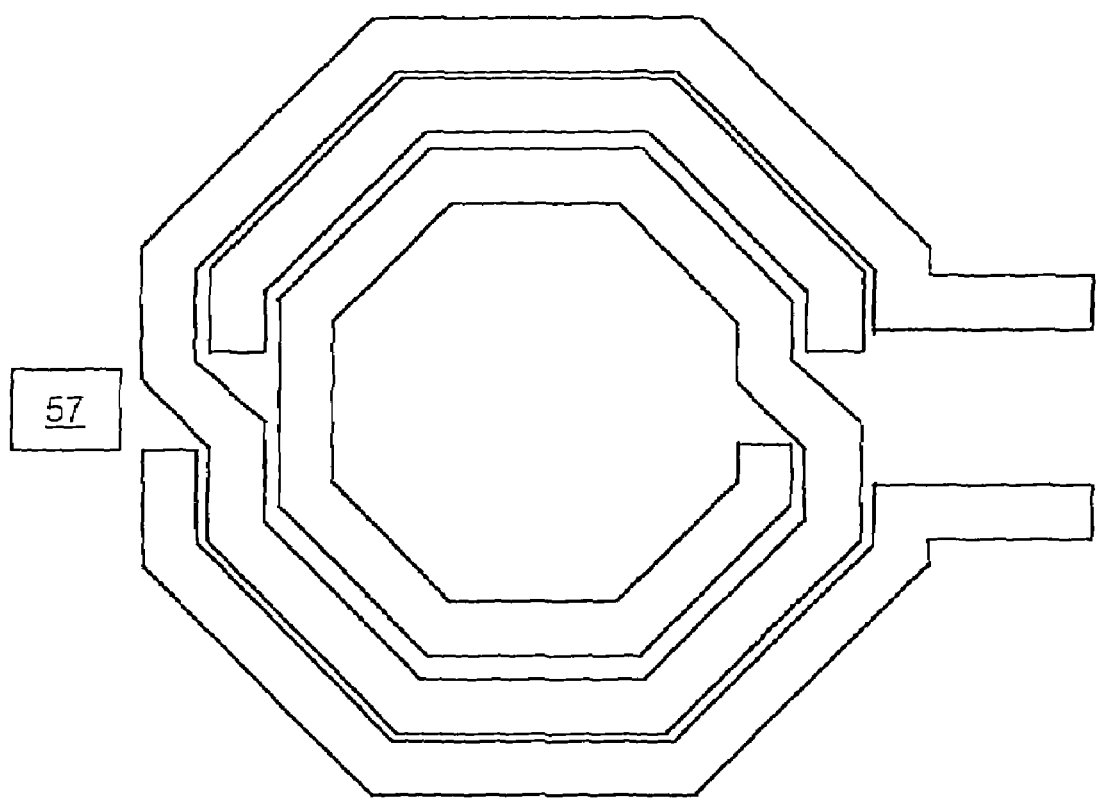
FIGS. 3–5 are plan views of layers of conductors forming the prior art center tap inductor of FIG. 1.

The conductors forming the drawn inductors of FIGS. 1 and 2 reside on more than one layer of the IC that are separated by insulating layers, with conductive vias 30 providing vertical paths between conductors residing on different layers. FIGS. 1 and 2 are simplified in that they show the conductors forming the inductors but do not show the insulating layers between them. The conductors forming drawn inductor of FIG. 1 could, for example, reside on three separate conductive layers as illustrated in FIG. 3 (top layer), FIG. 4 (middle layer) and FIG. 5 (lower layer.)

IC fabricators typically impose several design rules/restrictions on the spiral of a drawn inductor. For example, an IC fabricator may require the following:

(1) The spiral must have a uniform wire width (dimension 32 of FIG. 1) on each metal layer.

(2) The spiral must have uniform horizontal spacing (dimension 34 on FIG. 1) between turns of the wire on all layers.

(3) The spiral must have a uniform inner diameter (dimension 36 on FIG. 1 or 37 of FIG. 2).

(4) The spiral must have uniform "bend angles" 38 between successive straight sections of conductive material forming the spiral. For example, an octagonal spiral may consists of only 45 degree bend angles as does the spiral of FIG. 1 or a square spiral may have only y 90 degree bend angles as does the spiral of FIG. 2. But a spiral may not comprise both 45 degree and 90-degree bend angles.

Since a drawn inductor is considered faulty if it breaks any of the above rules, a designer finds it helpful before submitting an IC layout design for fabrication to perform a "uniformity check" of each drawn inductor within the layout to determine whether it satisfies the above design rules. A designer would also find it helpful to perform a "connectivity check" on each drawn inductor to determine whether it provides an adequate amount of conductor-to-conductor contact area between its spiral and its center tap or spoke terminal and to determine whether vias properly interconnect multiple layers of conductors forming a part of the center tap or spoke terminal. The designer will also want to verify the inductance of each drawn inductor by first extracting geometric parameters describing the drawn inductor device such as its spiral length, spiral spacing, spiral inner diameter, total number of turns, and the number of sides per turn. The designer or analysis software can then calculate the inductor's inductance using well-known inductance formula, such as, for example, the Current Sheet Approximation Formula described in "Simple Accurate Expressions for Planar Spiral Inductances" by S. Mohan, et al., *IEEE J. Solid-State Circuits*, vol. 34, pp. 1419–1424, October 1999.

Center Tap Inductor

Figure 6:
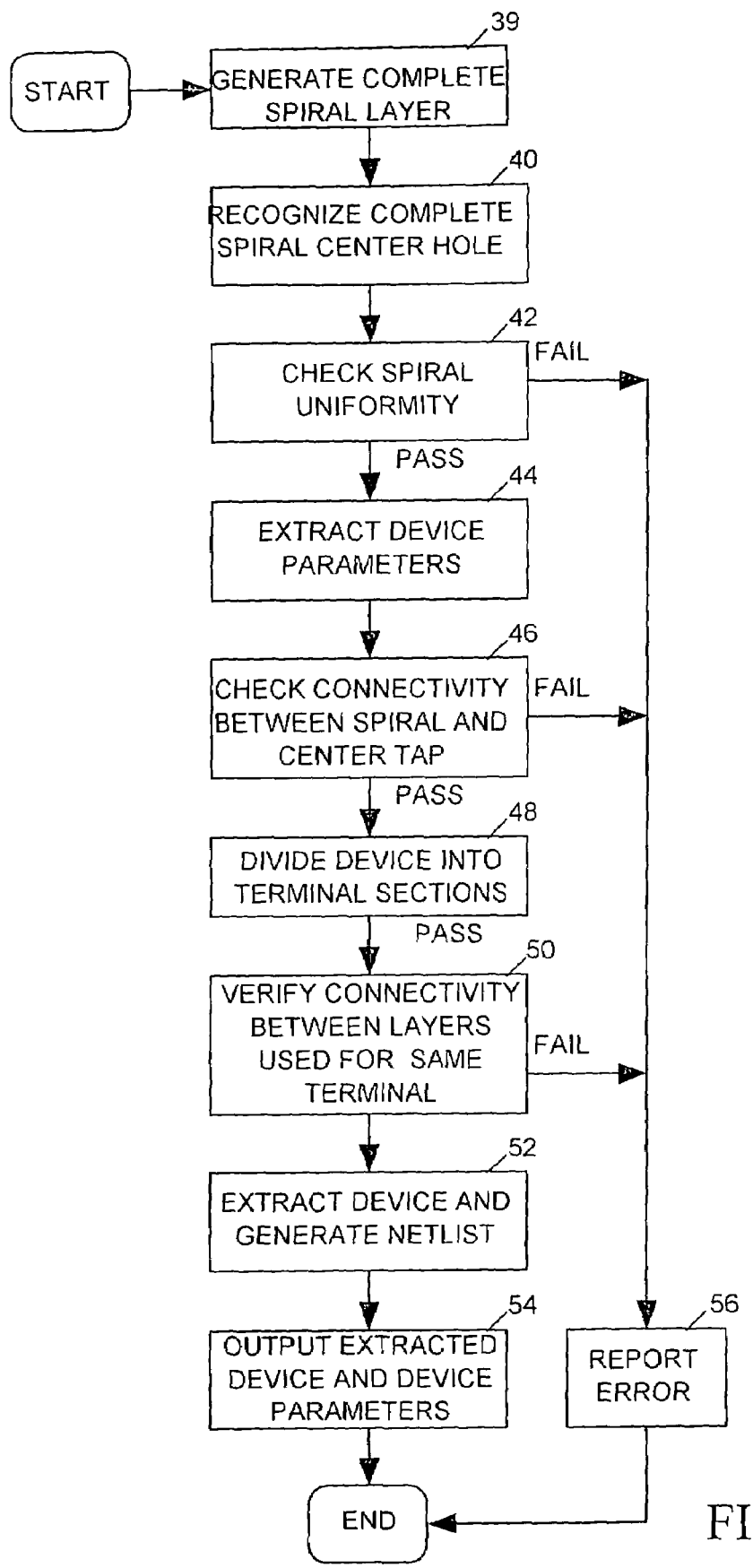
FIG. 6 is a process flow diagram of a method in accordance with the invention for an IC layout physical verification of a center tap inductor.

FIG. 6 is a process flow diagram for an LVS tool in accordance with the invention for processing a layout to automatically recognize drawn inductors and for carrying out the uniformity check, terminal connectivity check, inductor device extraction and inductor device parameter extraction with respect to center-tap inductors. Starting at step 39, the LVS tool processes data describing the IC layout to create data defining a "recognition layer" describing a "boundary shape" of the spiral of each inductor. The boundary shape of a spiral is the shape of all of the conductive material forming the spiral as viewed from above with all of the layers of conductive material forming the spiral superimposed.

Figure 4:
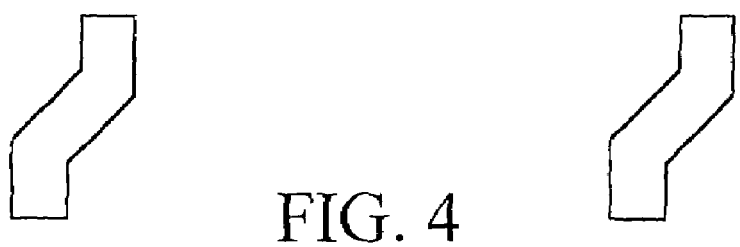
Figure 5:
Figure 7:
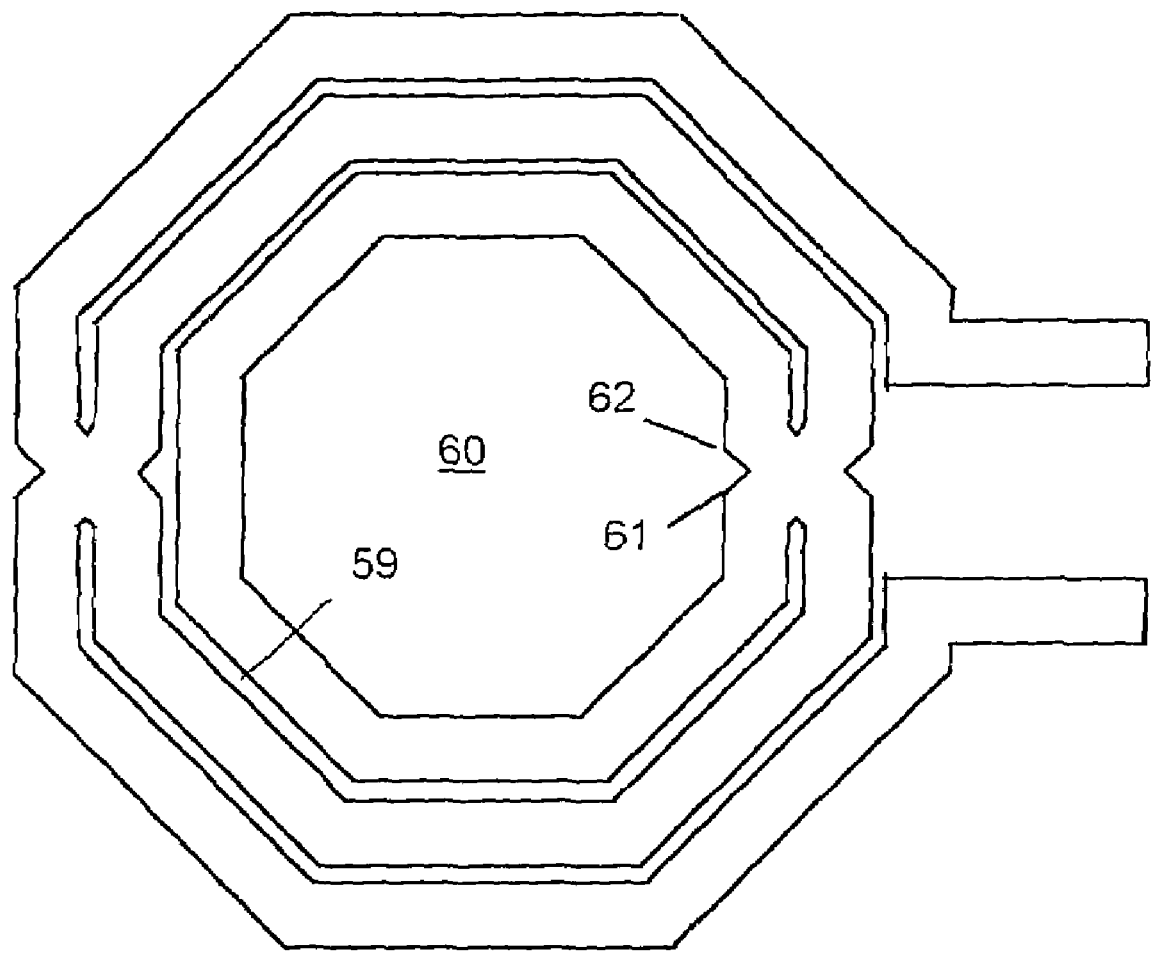
FIG. 7 is a plan a view of a spiral boundary shape corresponding to the central tap inductor of FIG. 1.

FIG. 7 illustrates a boundary shape of the spiral of center tap inductor of FIG. 1 that would appear on the recognition layer. The boundary shape is a combination of the shapes of conductors forming the spiral of the drawn inductor and does not include conductors forming the center tap. It is essentially a two-dimensional view of the conductors forming the spiral as they would appear looking downward on the IC if all other layers were transparent. The LVS creates the recognition layer as the Boolean OR of the matrixes forming the layers containing portions of the spiral, excluding any section of material on either of these layers fully bounded by the center tap. Referring, for example to FIGS. 3–5, the layer depicted by FIG. 5 contains only material forming a part of the center tap and it defines the boundaries of the center tap in the horizontal plane of the layout. Since the center tap fully bounds conductor 57 on the layer depicted by FIG. 3, the boundary shape for the spiral depicted by FIG. 7 becomes the OR of the shapes on FIG. 3 and FIG. 4 exclusive of conductor 57 which is considered to be a part of the center tap.

The LVS tool then processes the data describing the recognition layer to identify each inductor and its position within the layout based on its boundary shape (step 40). For example, the boundary shape of FIG. 7 has several holes in the conductive material forming the boundary shape such as, for example, holes 58, 59 and 60, but only hole 60 is the center hole of an inductor spiral. Note that center hole 60 includes exactly two bend points 61 having angles larger than 180 degrees. Other holes in the spiral, such as holes 58 and 59 have more than two bend points defining angle greater than 180 degrees. The LVS tool can therefore identify the center hole of the spiral of each center tap inductor by finding the holes having exactly two 180+ degree bend points. The LVS tool can then identify the complete recognition shape of a center tap inductor as comprising all contiguously interconnected material surrounding its center hole. Having identified the boundary shape of a drawn inductor, the LVS tool next modifies the boundary shape as shown in FIG. 8 to eliminate bend points 61 and 62, thereby converting the center hole 60 into a regular polygon.

Next the LVS tool processes the boundary shape of each identified spiral to carry a uniformity check on the spiral (step 42) to determine whether each of the following are true:

1. The spiral exhibits a uniform wire width on each metal layer.
2. The spiral it has uniform horizontal spacing between turns of the wire
3. The spiral has a uniform inner diameter.
4. The spiral has uniform bend angles between successive sections of wire forming the spiral.

Figure 8:
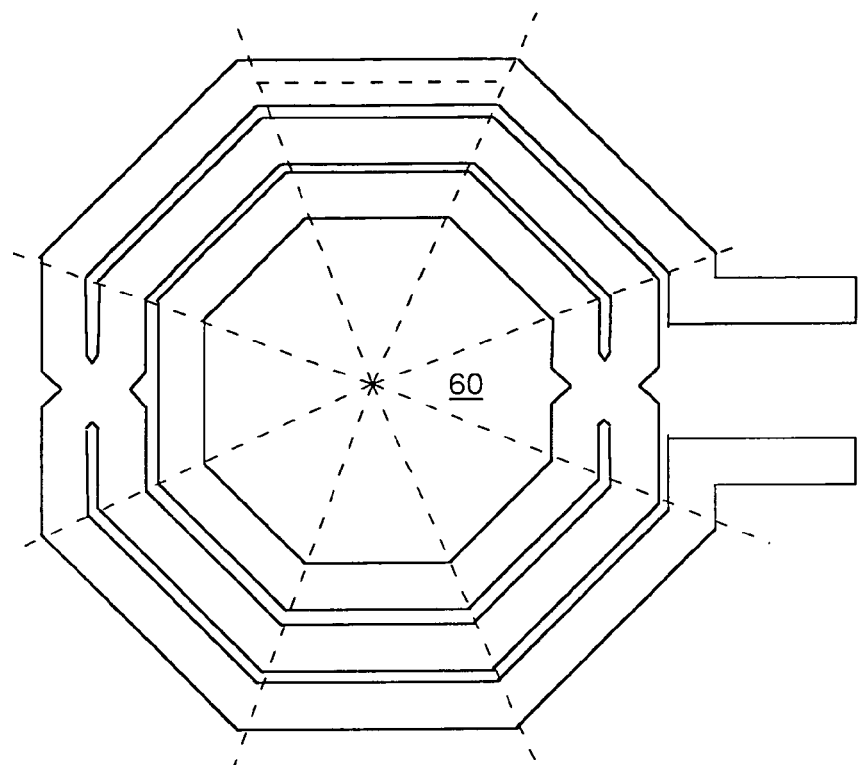
FIG. 8 is a plan view of the spiral boundary shape of FIG. 7 illustrating how the method of FIG. 7 divides it into sections.

At this point the complex problem of determining bend angle uniformity of the spiral shape has been reduced to the relatively simple problem of determining whether the modified center hole 60 of FIG. 8 of the modified boundary shape is a regular polygon. If the modified center hole is not a regular polygon, the LVS tool determines at step 42 that the spiral shape does not pass the uniformity check and that the drawn inductor is malformed.

If the modified central hole 60 is a regular polygon, the LVS tools next determines at step 42 whether the complete spiral has uniform conductor width and spacing. Since the spiral shape of FIG. 8 is complex, the LVS tool divides the conductors forming the spiral into a set of segments as illustrated by the dotted lines in FIG. 8. Note that all of the shapes are polygons, with most being trapezoidal, although two of the sections at the cross-over are X-shaped and two segments at the spiral ends are L-shaped polygons. The LVS tool separately processes each polygonal segment at step 42 to determine whether the conductor segments have uniform width and spacing.

Figure 9:
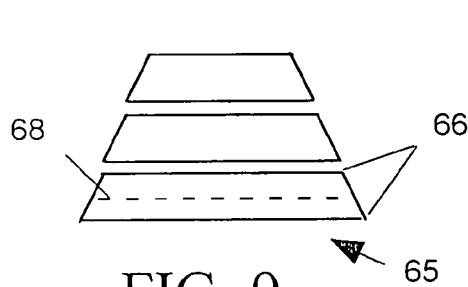
FIGS. 9 and 10 are plan view of two separate sections of the spiral boundary shape of FIG. 8.

FIG. 9 illustrates a segment of the boundary shape of FIG. 8 including three trapezoidal segments 65. To check conductor width uniformity, the LVS tool need only determine the distance between lines 66 forming each conductor segment, and to check conductor spacing uniformity, the LVS tool need only determine the distance between lines of adjacent conductor segments.

Figure 10:
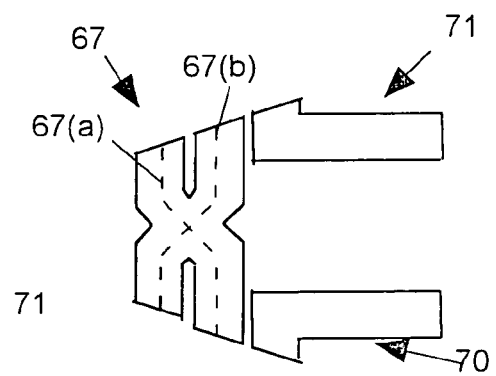

FIG. 10 illustrates a section of the boundary shape of FIG. 8 containing a crossover-segment 67 and two L-shaped spiral end segments 70 and 71. To check conductor width and spacing uniformity for this section, the LVS tool first converts the X-shaped crossover segment into 67 into two trapezoidal segments 72 and 73 and then checks the width and spacing uniformity and computes the average length of those two trapezoidal segments. The LVS tool also computes length of each L-shaped end segment 70 and 71. For example the length of segment 71, represented by dotted line 78 is the average length of the segment's sides 76 and 77.

If the spiral passes the uniformity test, the LVS tool next (step 44) processes the recognition layer data defining the boundary shape to extract the device parameters the user will need to calculate the spiral's inductance including, for example, length, spiral spacing, spiral inner diameter, total number of turns, and the number of sides per turn. The LVS tool processes the boundary shape of FIG. 8 and its segments to determine values of parameters the designer needs to compute inductance. The parameters include spiral length, conductor spacing, spiral inner diameter, total number of turns, and the number of sides per turn. At this point the LVS tool will already know the spacing of the spiral conductors, having obtained that information while performing the uniformity check at step 42 and will know the number of sides per turn (eight, for the example of FIG. 8) based on the geometric shape of center hole 60. The number of turns (three in the example of FIG. 8) is easily determined by counting the number of conductors in any section of the spiral. The LVS tool determines the spiral inner diameter as the distance between any two opposing sides of center hole 60.

Figure 11:
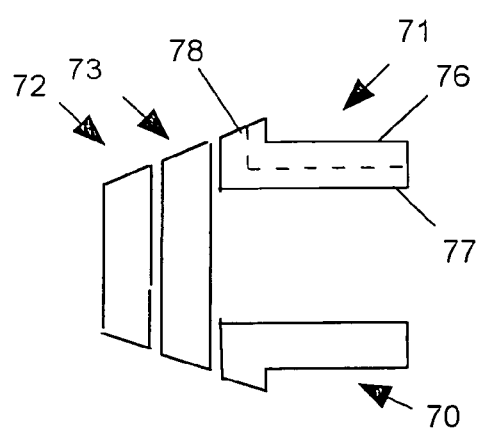
FIG. 11 is a plan view of a modified version of the spiral boundary shape section of FIG. 10.

The LVS tool calculates the length of each straight segment in any spiral section at step 44 as the average of the line segment pairs forming its boundaries. For example the length of one of the spiral sections 65 of FIG. 9 calculated as the average length of the line segments 66, graphically depicted in FIG. 9 by dashed line 68. The LVS tool treats crossover segment 67 of FIG. 10 as two straight segments 72 and 73 (FIG. 11) having lengths illustrated by dotted lines 74 and 75. The LVS tool calculates the length of spiral end 71 of FIG. 11 as the average length of its bounding lines 76 and 77, as illustrated by dotted line 78, and computes the length of spiral end 70 in a similar manner. The LVS tool totals the computed section lengths to determine the total spiral length.

Figure 12:
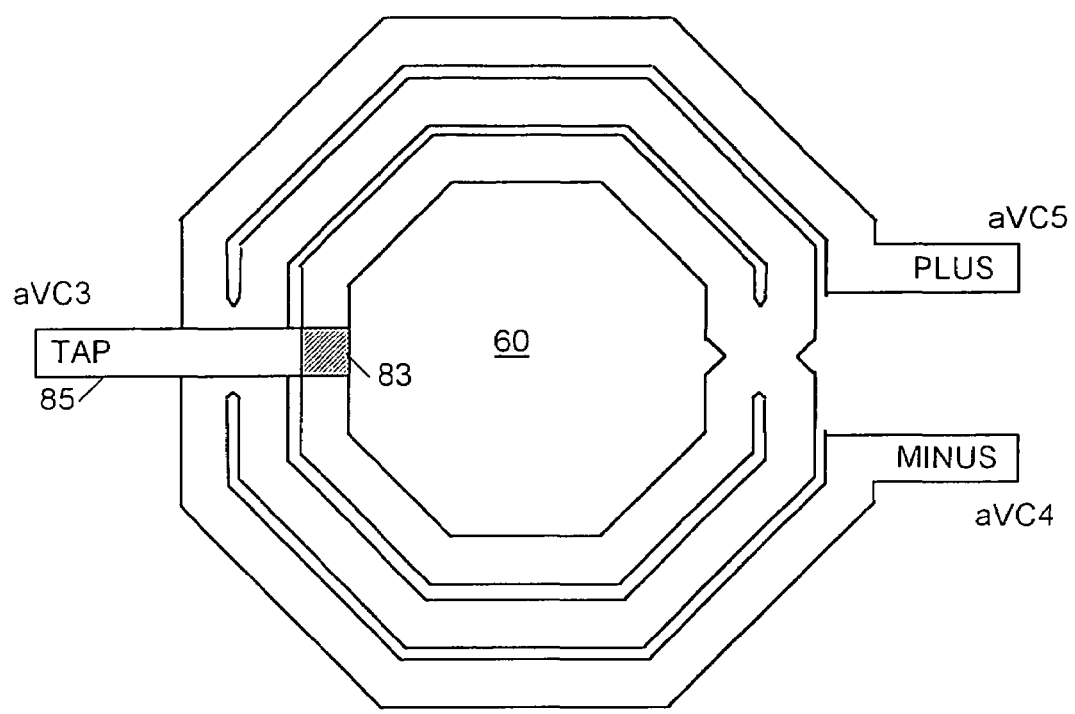
FIG. 12 is a plan view of a center tap terminal overlapping the spiral boundary shape of FIG. 7.

The LVS tool then checks the connectivity between the spiral and center tap (step 46). To do so, the LVS tool first performs a Boolean operation on the center hole and the layer containing the center tap to determine which shape abuts the center hole. For example, given the drawn inductor of FIG. 1, the LVS tool determines, as illustrated in FIG. 12, that a center tap area 80 abuts center hole 60. To verify the connectivity between the spiral and center tap, the LVS tool performs a Boolean AND operation to determine the area 82 of overlap between the center tap and the inner ring of the spiral, and then determines whether that area is sufficiently large to provide adequate connectivity.

Figure 13:
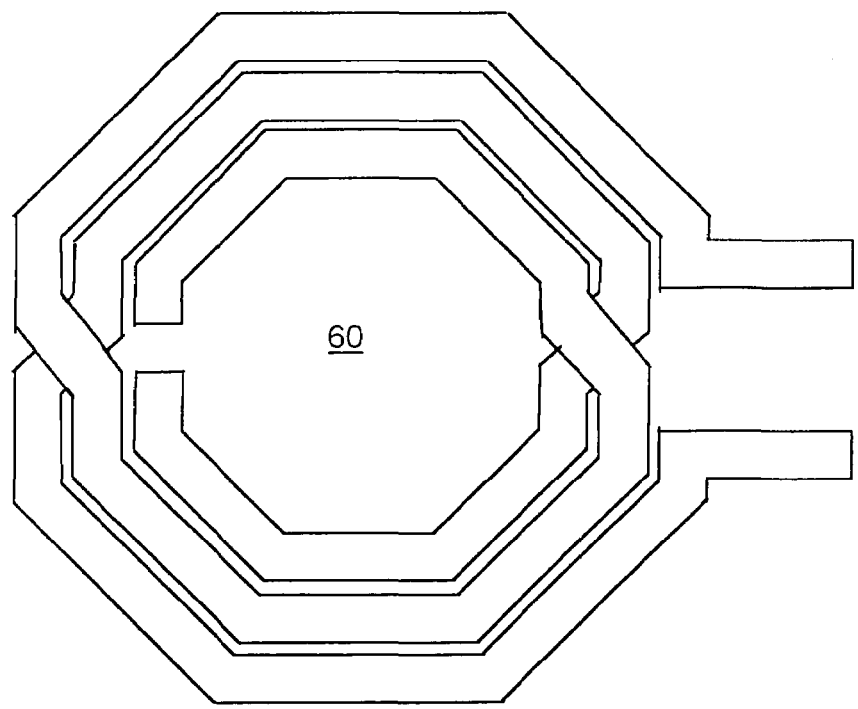
FIG. 13 is a simplified plan view of the spiral of the inductor of FIG. 1 divided to form two terminals.

After verifying the connectivity between the various spiral layers and multiple center tap layers (step 48), the LVS tool modifies the layout data to divide the conductive material forming the center tap inductor device into three terminal sections, two spiral terminals and the center tap terminal, (step 50). To do so, the LVS tool removes the area of overlap 82 of FIG. 12 from the spiral as illustrated in FIG. 13 to divide the spiral into two terminal sections. This also effectively removes the connection between the spiral and center tap, so the center tap terminal can be treated as a third device terminal.

The LVS tool then employs a conventional device extraction algorithm to generate a netlist (step 52) describing the drawn inductor as a three terminal device, with the netlist including the parameters needed to compute device inductance. For example a netlist describing the inductor of FIG. 1 might appear as follows:

c L_M6543H3 Generic P1 NONE P2 NONE TAP NONE BN NONE;
★4 pins
★4 nets
★0 instances
e
c "IND2T_M3M4M5M6_ID69_NT3_CT layoutA SILIB" Cell TAP NONE P1 NONE
avC3 NONE avC4 NONE avC5 NONE avC6 NONE;
★6 pins
★6 nets
★1 instances
i avD913_1 L_M6543H3 avC5 avC4 avC3 avC6; centerTapL 44 hdlmodel "L_M6543H3" inner_diameter 69.0136 nQuarter 3 side 8 spacing 2 spiralL 1004.15 width 7.5;
e The above netlist indicates the nature of the center tap inductor device, names its terminals and lists the device parameters that control its inductance.

The LVS tool then supplies the netlist, including the calculated device parameters as output (step 54). If a drawn inductor fails any of the tests carried out at steps 42, 46 or 48, the LVS tool reports the error to the user (step 56) and immediately ends the procedure.

Spiral Inductor

Figure 14:
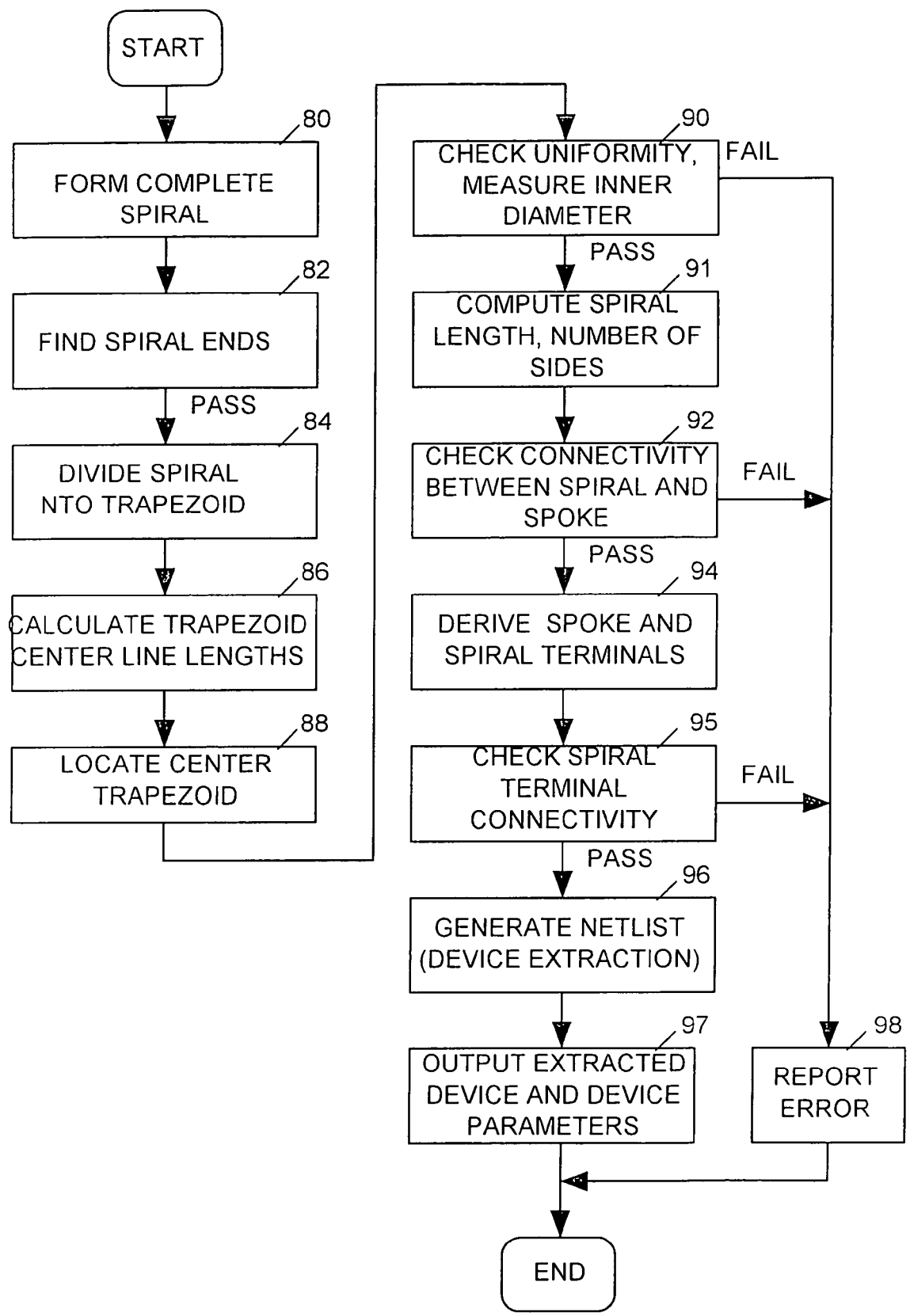
FIG. 14 is a process flow diagram of a method in accordance with the invention for an IC layout physical verification of a spiral inductor.

FIG. 13 illustrates a process flow the LVS tool in accordance with the invention carries out with respect to spiral inductors. During step 80, the LVS tool creates the recognition layer and then identifies each spiral inductor by its boundary shape on the recognition layer in a manner generally similar to the process described above in connection with step 40 of FIG. 6. For example the boundary shape for the spiral inductor of FIG. 2 appears as illustrated in FIG. 14.

After recognizing the boundary shape of the spiral inductor, the LVS tool traces the spiral shape and to find the two line ends 100 and 102 of the spiral (step 82). The LVS then determines which end (the "center line end" 100) is at the center of the spiral, and which end (the "outer line end" 102) is at the outmost turn of the spiral. To do so, the LVS tool first divides the spiral into trapezoids along cut lines passing through its bend angles as illustrated in FIG. 14 (step 84). Then for each trapezoid, the LVS tool calculates the length of its centerline 104 as the average of its two longest sides (step 86). Note that the centerline length is larger for trapezoids more distant from centerline end 100. The LVS tool uses this characteristic to locate the "center trapezoid" 106 containing centerline end 100 (step 88).

The LVS tool then traverses the spiral starting with center trapezoid 106, checking spiral conductor width, spacing and bend angles for uniformity (step 90). During the traversal, the LVS tool also measures the inner diameter 108 of the spiral as the distance between opposing inner edges. The LVS tool then calculates spiral length by summing the individual trapezoid lengths and computes the number of inductor sides as a function of its uniform bend angle.

Figure 15:
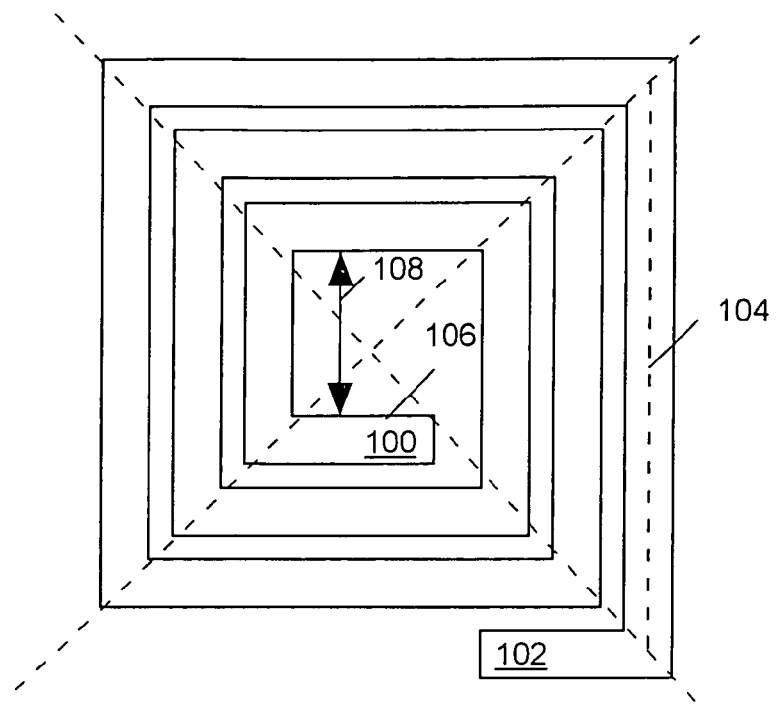
FIG. 15 is a plan a view of a spiral boundary shape corresponding to the spiral inductor of FIG. 2.
Figure 16:
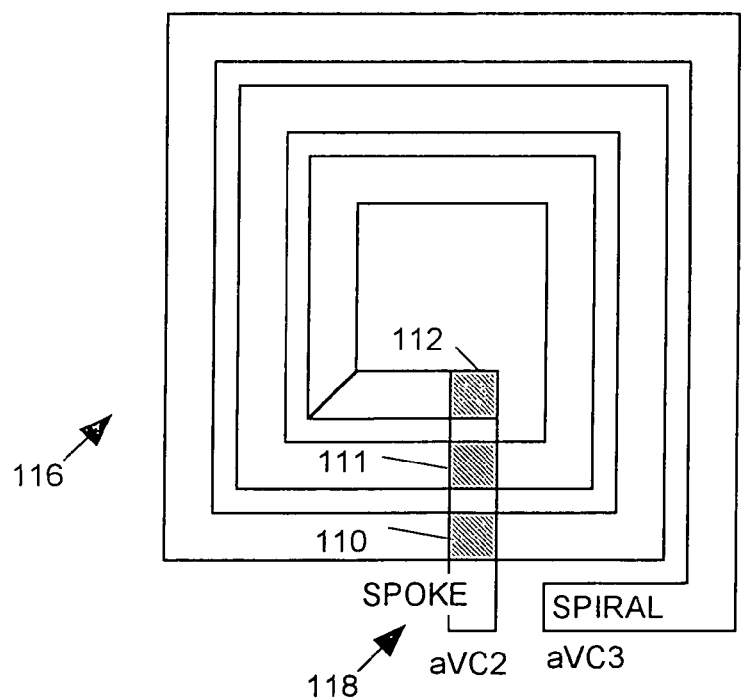
FIG. 16 is a plan a view of a spiral boundary shape corresponding to the spiral inductor of FIG. 2 upon which has been superimposed a shape of the spoke of the spiral inductor.

The LVS tool then determines whether there is a valid connection between the spiral and the spoke (step 91). To do so the LVS tool first performs a Boolean AND operation on the layers containing the spiral and the spoke to locate overlapping areas 110–112 (FIG. 15) of spiral and the spoke and then selects the overlapping area 112 included in the center trapezoid 100 as the "connected area". The LVS tool can then verify connectivity between the spiral 116 and spoke 118 by determining whether the connected area 112 is sufficiently large (step 92).

One of the layers (the "MET" layer), includes conductors forming both the both spiral and spoke while another layer includes a conductor forming only the spoke. To prepare the layout for extraction of the spiral inductor as a two-terminal device, the LVS tool first isolates the spiral and spoke terminals by removing the vias within the connected area 112 and then derives two layers from the MET layer, one (the "MET_SPIRAL" layer) for use as a spiral terminal, the other (the "MET_SPOKE" layer) for use as spoke terminal (step 94). To do so, the LVS tool carries out the following Boolean operations:

MET_SPIRAL=Boolean Overlap(MET, CONNECT_AREA)

MET_SPOKE=Boolean Inside(MET, COMPLETE_SPOKE)

The MET_SPIRAL layer is the portion of the MET shape overlapping the connected area, while MET_SPOKE layer is the portion of the MET shape fully enclosed by the complete spoke.

After checking whether portions of the spoke terminal residing on more than one layer are properly interconnected (step 95), the LVS tool performs the spiral inductor device extraction (step 96) to generate a netlist describing the inductor as a two-terminal device. The LVS tool then (step 97) provides as output the netlist for the spiral inductor including its device parameters, for example as follows:

c L_M6543H IND SPIRAL NONE SPOKE NONE SUBSTRATE NONE;
★3 pins
★3 nets
★0 instances
c "IND2T_M4M5M6 layoutA SILIB" Cell MINUS NONE avC2 NONE avC3 NONE
avC4 NONE;
4 pins
4 nets
1 instances
i avD878_1 L_M6543H avC3 avC2 avC4; hdlmodel "IND_M3M4" inner_diameter 125 1 8.85206e-09
model "M3M4_INDUCTOR_LS_RFSIGE1" nQuarter 6
spacing 2 spiralL 3597.41
spokeL 82 sprlSide 8
width 7.5;
e Should the inductor layout fail any of the tests at steps 90, 92 or 95, the LVS tool reports the error (step 98) and terminates the process.

The foregoing specification and the drawings depict exemplary embodiments of the best mode(s) of practicing the invention, and elements or steps of the depicted best mode(s) exemplify the elements or steps of the invention as recited in the appended claims. However the appended claims are intended to apply to any mode of practicing the invention comprising the combination of elements or steps as described in any one of the claims, including elements or steps that are functional equivalents of the example elements or steps of the exemplary embodiment(s) of the invention depicted in the specification and drawings.

The invention claimed is:

1. An integrated circuit (IC) physical verification method comprising the steps of:
   a. processing layout data describing positions of conductive material residing on layers of an IC including a drawn inductor having a spiral to produce recognition layer data representing a two-dimensional boundary shape of the spiral that is a composite of two-dimensional shapes of all conductive material forming the spiral; and
   b. processing the recognition layer data to generate parameter data describing a shape of the spiral the shape being divided into a plurality of polygonal segments for separate processing relating thereto; wherein the drawn inductor includes a center tap or spoke coupled to the spiral, the layout data includes first binary data corresponding respectively to layers upon which conductive material forming the spiral and the center tap or spoke reside, the recognition layer data comprising second binary data generated as a Boolean function of portions of the first binary data; and
   wherein the second binary data distinguishes positions of all conductive material forming the spiral from positions of any conductive material forming the center tap or spoke, the processing thereby determining an area of overlap between the center tap or spoke and spiral.

2. The method in accordance wit claim 1 further comprising the step of:
   c. processing the recognition layer data to determine whether the spiral has turns of uniform width.

3. The method in accordance with claim 1 further comprising the step of:
   c. processing the recognition layer data to determine whether all bends in the spiral are of uniform bend angle.

4. The method in accordance with claim 1 further comprising the step of:
   c. processing the recognition layer data to identify a position of the spiral.

5. The method in accordance with claim 1 wherein the parameter data indicates at least one of the following:
   a length of the spirals;
   a width of conductive material forming turns of the spiral; and
   spacing between conductive material forming turns of the spiral.

6. The method in accordance with claim 1 wherein the parameter data indicates at least one of the following:
   a number of sides of the spiral; and
   a diameter of an area bounded by the spiral.

7. The method in accordance with claim 1 further comprising the step of:
   c. processing the recognition layer data to determine whether all bends in conductors forming the spiral are of uniform bend angle.

8. The method in accordance with claim 1 wherein the boundary shape includes a plurality of polygonal shapes representing shapes of conductive material forming the spiral, and wherein step b comprises the substeps of:
   b1. processing the recognition layer data to identify each polygonal shape and to determine a length of each identified polygonal shape; and
   b2. summing the computed lengths of the polygonal shapes to determine a length of the spiral.

9. The method in accordance with claim 1 wherein the boundary shape includes a plurality of polygonal shapes representing shapes of conductive material forming the spiral, and wherein step b comprises the substep of:
   b1. processing the recognition layer data to identify each polygonal shape and to determine a width of each identified polygonal shape.

10. The method in accordance with claim 1 further comprising the step of:
c. processing the recognition layer data boundary shape to generate a netlist representation of the drawn inductor.

11. The method in accordance with claim 10 wherein the netlist representation of the drawn inductor includes data describing physical characteristics of the inductor influencing its inductance.

12. The method in accordance wit claim 1 further comprising the steps of:
c. processing the recognition layer data to determine a position of the inductor within the layout based on a position of the boundary shape of its spiral indicated by the recognition layer data;
d. processing the recognition layer data to determine whether all bends in conductors forming the spiral are of uniform bend angle;
e. processing the layout data to determine whether conductive material residing on separate layers and forming portions of the spiral inductor are interconnected.

13. The method in accordance with claim 12 further comprising the steps of:
f. processing the recognition layer data to determine parameters relating to a shape of the spiral influencing the spiral's inductance; and
g. processing the data representing the layout to generate a netlist description of the spiral inductor including the parameters determined at step f.

14. An integrated circuit (IC) physical verification method comprising the steps of:
a. processing layout data describing positions of conductive material residing on layers of an IC including a drawn inductor having a spiral to produce recognition layer data representing a two-dimensional boundary shape of the spiral that is a composite of two-dimensional shapes of all conductive material forming the spiral; and
b. processing the recognition layer data to generate parameter data describing a shape of the spiral;
wherein the inductor is a center tap inductor including the spiral and a center tap coupled to a central portion of the spiral;
wherein the layout data comprises first binary data corresponding to each layer indicating positions of conductive material on the corresponding layer;
wherein the recognition layer data comprises second binary data generated as a Boolean function of portions of the first binary data corresponding respectively to layers upon which conductive material forming the spiral and the center tap reside; and
wherein the second binary data distinguishes positions of all conductive material forming the spiral from positions of any conductive material forming the center tap, the processing thereby determining an area of overlap between the center tap and spiral.

15. An integrated circuit (IC) physical verification method comprising the steps of:
a. processing layout data describing positions of conductive material residing on layers of an IC including a drawn inductor having a spiral to produce recognition layer data representing a two-dimensional boundary shape of the spiral that is a composite of two-dimensional shapes of all conductive material forming the spiral; and
b. processing the recognition layer data to generate parameter data describing a shape of the spiral;
wherein the inductor is a spiral inductor including the spiral and a spoke coupled to one end of the spiral;
wherein the layout data comprises first binary data corresponding to each layer indicating positions of conductive material on the corresponding layer;
wherein the recognition layer data comprises second binary data generated as a Boolean function of portions of the first binary data corresponding respectively to layers upon which conductive material forming the spiral and the spoke reside; and
wherein the second binary data distinguishes positions of all conductive material forming the spiral from positions of any conductive material forming the spoke, the processing thereby determining an area of overlap between the spoke and spiral.

16. Computer-readable media containing software which when read and executed by a computer causes the computer to carry out an integrated circuit (IC) physical verification method comprising the steps of:
a. processing layout data describing positions of conductive material residing on layers of an IC including a drawn inductor having a spiral to produce recognition layer data representing a two-dimensional boundary shape of the spiral that is a composite of two-dimensional shapes of all conductive material forming the spiral; and
b. processing the recognition layer data to generate parameter data describing a shape of the spiral the shave being divided into a plurality of polygonal segments for separate processing relating thereto; wherein the drawn inductor includes a center tap or spoke coupled to the spiral, the layout data includes first binary data corresponding respectively to layers upon which conductive material forming the spiral and the center tap or spoke reside, the recognition layer data comprising second binary data generated Boolean function of portions of the first binary data; and
wherein the second binary data distinguishes positions of all conductive material forming the spiral from positions of any conductive material forming the center tap or spoke, the processing thereby determining an area of overlap between the center tap or spoke and spiral.

17. The computer-readable media in accordance with claim 16 wherein the method further comprises the step of:
c. processing the recognition layer data to determine whether the spiral has turns of uniform width.

18. The computer-readable media in accordance with claim 16 wherein the method further comprises the step of:
c. processing the recognition layer data, to determine whether all bends in the spiral are of uniform bend angle.

19. The computer-readable media in accordance with claim 16 wherein the method further comprises the step of:
c. processing the recognition layer data to identify a position of the spiral.

20. The computer-readable media in accordance wit claim 16 wherein the parameter data indicates at least one of the following:
a length of the spiral;
a width of conductive material forming turns of the spiral; and spacing between conductive material forming turns of the spiral.

21. The computer-readable media in accordance with claim 16 wherein the parameter data indicates at least one of the following:
a number of sides of the spiral; and
a diameter of an area bounded by the spiral.

22. The computer-readable media in accordance with claim 16 wherein the method further comprises the step of:
  c. processing the recognition layer data to determine whether all bends in conductors forming the spiral are of uniform bend angle.

23. The computer-readable media in accordance with claim 16 wherein the boundary shape includes a plurality of polygonal shapes representing shapes of conductive material forming the spiral, and wherein step b comprises the substeps of:
  b1. processing the recognition layer data to identify each polygonal shape and to determine a length of each identified polygonal shape; and
  b2. summing the computed lengths of the polygonal shapes to determine a length of the spiral.

24. The computer-readable media in accordance with claim 16 wherein the boundary shape includes a plurality of polygonal shapes representing shapes of conductive material forming the spiral, and wherein step b comprises the substep of:
  b1. processing the recognition layer data to identify each polygonal shape and to determine a width of each identified polygonal shape.

25. The computer-readable media in accordance with claim 16 wherein the method further comprises the step of:
  c. processing the recognition layer data boundary shape to generate a netlist representation of the drawn inductor.

26. The computer-readable media in accordance with claim 25 wherein the netlist representation of the drawn inductor includes data describing physical characteristics of the inductor influencing its inductance.

27. The computer-readable media in accordance with claim 16 wherein the method further comprises the steps of:
  c. processing the recognition layer data to determine a position of the inductor within the layout based on a position of the boundary shape of its spiral indicated by the recognition layer data;
  d. processing the recognition layer data to determine whether all bends in conductors forming the spiral are of uniform bend angle;
  e. processing the layout data to determine whether conductive material residing on separate layers and forming portions of the spiral inductor are interconnected.

28. The computer-readable media in accordance with claim 27 wherein the method farther comprises the steps of;
  f. processing the recognition layer data to determine parameters relating to a shape of the spiral influencing the spiral's inductances; and
  g. processing the data representing the layout to generate a netlist description of the spiral inductor including the parameters determined at step f.

29. Computer-readable media containing software which when read and executed by a computer causes the computer to carry out an integrated circuit (IC) physical verification method comprising the steps of:
  a. processing layout data describing positions of conductive material residing on layers of an IC including a drawn inductor having a spiral to produce recognition layer data representing a two-dimensional boundary shape of the spiral that is a composite of two-dimensional shapes of all conductive material forming the spiral; and
  b. processing the recognition layer data to generate parameter data describing a shape of the spiral;
  wherein the inductor is a center tap inductor including the spiral and a center tap coupled to a central portion of the spiral;
  wherein the layout data comprises first binary data corresponding to each layer indicating positions of conductive material on the corresponding layer;
  wherein the recognition layer data comprises second binary data generated as a Boolean function of portions of the first binary data corresponding respectively to layers upon which conductive material forming the spiral and the center tap resides; and
  wherein the second binary data indicates positions of all conductive material forming the spiral and refrains from indicating positions of any conductive material forming the center tap the processing thereby determining an area of overlap between the center tap and spiral.

30. Computer-readable media containing software which when read and executed by a computer causes the computer to carry out an integrated circuit (IC) physical verification method comprising the steps of:
  a. processing layout data describing positions of conductive material residing on layers of an IC including a drawn inductor having a spiral to produce recognition layer data representing a two-dimensional boundary shape of the spiral that is a composite of two-dimensional shapes of all conductive material forming the spiral; and
  b. processing the recognition layer data to generate parameter data describing a shape of the spiral;
  wherein the inductor is a spiral inductor including the spiral and a spoke coupled to one end of the spiral;
  wherein the layout data comprises first binary data corresponding to each layer indicating positions of conductive material on the corresponding layer;
  wherein the recognition layer data comprises second binary data generated as a Boolean function of portions of the first binary data corresponding respectively to layers upon which conductive material forming the spiral and the spoke resides; and
  wherein the second binary data indicates positions of all conductive material forming the spiral and refrains from indicating positions of any conductive material forming the spoke the processing thereby determining an area of overlap between the spoke and spiral.

* * * * *